United States Patent
Sakakima et al.

[11] Patent Number: 5,702,834
[45] Date of Patent: *Dec. 30, 1997

[54] MAGNETO-RESISTANCE EFFECT ELEMENT

[75] Inventors: Hiroshi Sakakima, Tsuzuki-gun; Mitsuo Satomi, Katano; Hiroshi Takeuchi, Matsubara, all of Japan

[73] Assignee: Matsushita Electric Industrial Co., Ltd., Japan

[*] Notice: The term of this patent shall not extend beyond the expiration date of Pat. No. 5,637,392.

[21] Appl. No.: 652,681

[22] Filed: May 30, 1996

Related U.S. Application Data

[63] Continuation of Ser. No. 31,726, Mar. 15, 1993, Pat. No. 5,637,392.

[30] Foreign Application Priority Data

Mar. 13, 1992 [JP] Japan .................... 4-54934

[51] Int. Cl.$^6$ ............................................. G11B 5/66
[52] U.S. Cl. .................... 428/692; 428/336; 428/671; 428/672; 428/673; 428/674; 428/675; 428/676; 428/678; 428/694 R; 428/694 T; 428/694 TS; 428/694 TM; 428/900

[58] Field of Search .................... 428/694 R, 694 T, 428/694 TS, 694 TM, 900, 336, 671, 672, 673, 674, 675, 676, 678, 692

[56] References Cited

U.S. PATENT DOCUMENTS 4,296,377  10/1981  Ohkubo .................... 324/252

FOREIGN PATENT DOCUMENTS

| 0503499 | 3/1992 | European Pat. Off. . |
| 0498344 | 8/1992 | European Pat. Off. . |
| 0503499 | 9/1992 | European Pat. Off. . |
| 3609006 | 9/1987 | Germany . |

*Primary Examiner*—Leszek Kiliman
*Attorney, Agent, or Firm*—Wenderoth, Lind & Ponack

[57] ABSTRACT

Disclosed is a magneto-resistance effect element indicating a larger magneto-resistance effect at room temperature under impression of low magnetic field is obtained with the construction wherein the characteristics of artificial metallic lattice membrane are exploited.

2 Claims, 1 Drawing Sheet

MAGNETO-RESISTANCE EFFECT ELEMENT

This is a continuation application of Ser. No. 08/031,726, filed Mar. 15, 1993, now U.S. Pat. No. 5,637,392.

BACKGROUND OF THE INVENTION

1. Field of the Invention

The present invention relates to a magneto-resistance element such as a magneto-resistance sensor, a magneto-resistance head, etc.

2. Prior Arts

Development of magneto-resistance sensors (hereinafter called MR sensor) and magneto-resistance heads (hereinafter called MR head) utilizing magneto-resistance elements in which mainly $Ni_{0.8}Fe_{0.2}$ permalloy or $Ni_{0.8}Co_{0.2}$ alloy film is used as magnetic material has been promoted. In the case of these magneto-resistance effect materials, magneto-resistance variation rate (hereinafter called $\Delta R/R$) is about 2.5% and when it is actually used as the sensor or head, the magneto-resistance effect material is usually patterned as shown in FIG. 1 (b) and the element is so designed that the direction of electric current to run through the magneto-resistance effect material and the direction of magnetic field to be sensed make roughly right angle. The reason for it is that when the direction of electric current and the direction of magnetic field are in parallel, the magneto-resistance effect material practically generates no magneto-resistance variation rate ($\Delta R/R$). In order to make the magneto-resistance element more sensitive, it is desired that the magneto-resistance material has a larger magneto-resistance variation rate ($\Delta R/R$).

In recent years it has been discovered that a large magneto-resistance effect is obtained with [Fe/Cr], [Co/Ru] artificial lattice membrane which forms anti-ferrogmagnetic bonding via a metallic non-magnetic thin film made of Cr, Ru, etc. (Physical Review Letter Vol. 61, P2472, 1988; ditto Vol. 64, P2304, 1990). A large magneto-resistance effect was also found with [Ni—Fe/Cu/Co] artificial lattice membrane using magnetic thin film Ni—Fe and Co separated by metallic non-magnetic thin Cu film which is not making magnetic bonding and they obtained the film with $\Delta R/R$ of about 10% at room temperature and impression magnetic field of 3K Oe (Journal of Physical Society of Japan Vol. 50, P3061, 1990). A large magneto-resistance effect was further discovered with [Ni—Fe—Cu/Co], [Ni—Fe—Co/Cu] artificial lattice films using Ni—Fe—Cu/Co magnetic thin film which makes an anti-ferromagnetic bonding via Cu and they obtained a film with $\Delta R/R$ of about 15% at room temperature and impression magnetic field of 0.5 KOe (Technical Research Report MR91-9 of the Society of Electronic Data Communication). However even when such artificial metallic lattice film is patterned and the element is so constructed as the direction of electric current to run through the magneto-resistance effect material and the direction of magnetic field to be sensed should make roughly right angle as in the case of the conventional magneto-resistance material, the magnetic sensor or magnetic head with preferred characteristics is not obtained.

SUMMARY OF THE INVENTION

The present invention provides a high sensitive magneto-resistance element which exploits the characteristics of the metallic artificial lattice film, using an artificial metallic lattice membrane and a novel construction which is different from the conventional film made of the magneto-resistance effect material.

The magneto-resistance element of the present invention is so constructed that as shown in FIG. 1 (a), the direction of most part of electric current to run through the patterned magneto-resistance effect material should be roughly in parallel with the direction of the aforesaid external magnetic field and the magneto-resistance effect material comprises an artificial metallic lattice film composed of the magnetic thin film layer and the metallic non-magnetic thin film layer.

Especially it is preferred that the artificial lattice film has such composition that the magnetic thin film layer with thickness of 5–50 Å [1] and metallic non-magnetic thin film layer with thickness of 5–50 Å [2] are interchangeably laminated, provided that the magnetic thin film layer [1] should be mainly made of

$$(Ni_xCo_{1-x})_{x'}Fe_{1-x'} \tag{1}$$

wherein X and X' are respectively, by atomic composition ratio,

$$0.6 \leq X \leq 1.0, \ 0.7 \leq X' \leq 1.0 \tag{2}$$

and the metallic non-magnetic thin film layer [2] is made of anyone of Cu, Ag, Au, Pt or Ru, preferably Cu.

Other than the above, the one with such construction that the magnetic thin film layer with thickness of 5–50 Å [2] are interchangeably laminated may also be used, provided that the magnetic thin film layer [3] should be mainly made of

$$(Co_yNi_{1-y})_zFe_{1-z} \tag{3}$$

wherein Y and Z are respectively, by the atomic composition ratio,

$$0.4 \leq Y \leq 1.0, \ 0.8 \leq Z \leq 1.0 \tag{4}$$

and non-magnetic metallic thin film layer is made of anyone of Cu, Ag, Au, Pt or Ru, preferably Cu.

Furthermore, the lattice membrane may have such construction that the magnetic thin film layer with thickness of 5–50 Å [1] and magnetic thin film layer with thickness of 5–50 Å [3] are interchangeably laminated and a non-magnetic metallic thin film layer with thickness of 5–50 Å [2] is interposed between said laminated magnetic thin film layers. Here the magnetic thin film layer [1] is made of the soft magnetic material with small magnetostricture and small coercive force and magnetic thin film layer [3] is made of the magnetic material with small magnetostricture but different from magnetic thin film layer [1], the formula (2) and (4) being with the composition range required to satisfy said conditions. The magnetic thin film layer [1] may also be made of the system other than such 3-element system as above but it may be a 2-element magnetic thin film layer made of Ni—Fe or Ni—Co etc. which indicates soft magnetism and has relatively large $\Delta R/R$.

When the non-magnetic metallic thin film layer [2] is thin enough, the film layers may be magnetically bonded via the non-magnetic metallic thin film layer [2] and when such magnetic bonding is the so-called RKKY-type bonding, the bonding of magnetic thin film layers becomes anti-ferromagnetic bonding if the thickness of the non-magnetic metallic thin film layer should be thin enough [2] (for example around 9Å and 20 Å as indicated in the Examples given below), and it produces a large magneto-resistance effect. When they are bonded anti-ferromagnetically, the spin scattering of the conductive electrons becomes large and a large magneto-resistance ($\Delta R/R$) is obtained. When the magneto-resistance element as shown in FIG. 1 (a) is manufactured by patterning the artificial metallic lattice membrane composed of such magnetic thin film layer and non-magnetic metallic layer, a magneto-resistance effect element of preferred characteristics is obtained if it is composed in such way that the majority of the direction of current running through the mangeto-resistance effect material becomes roughly in parallel to the direction of said external magnetic field.

DESCRIPTION OF PREFERRED EMBODIMENT

Ni-rich Ni—Co—Fe alloy given in formula (1) shows small magnetostricture and soft magnetism when its composition satisfied formula (2). Typical examples of it are $Ni_{0.8}Co_{0.1}Fe_{0.2}$, $Ni_{0.8}Co_{0.2}$ etc. If necessary, Nb, Mo, Cr, W, Ru etc. may be added to the composition given in formula (1) to improve soft mangetism or to improve the abrasion resistance and corrosion resistance. Co-rich Co—Ni—Fe alloy which satisfies formula (3) shows relatively small magneto stricture and semi-rigid magnetic characteristics when it satisfies formula (4). Typical example of it is $Co_{0.8}Fe_{0.1}$, etc. In the case of these magnetic thin film layers, when its thickness is less than 5 Å, it causes such problems as decrease of magnetization at room temperature due to the decrease of Curie temperature though it varies depending on the composition and in the practical use, since the magneto-resistance element besides, is sued with total film thickness of several hundred angstrom, it is necessary to make the thickness of each magnetic film layer less than 100 Å preferably less than 50 Å in order to profitably utilize the lamination effect as in the case of the present invention. Therefore the thickness of these magnetic thin film layer is preferred to be 5–50 Å.

The magnetic thin film layer [1] is required to be a film with low magnetostricture having excellent soft magnetic characteristics. It is because, in the practical use, it is required to function in a weak magnetic field and when it is used for MR head etc., a large magnetostricture causes large noise. An example of the film which satisfies such conditions is the Ni-rich Ni—Fe—Co type film as indicated by the aforesaid forumlae (1) and (2). Magnetic thin film layer [3] is also preferred to have small magneto-resistance element with ΔR/R larger than those of the elements composed of only magnetic thin film layer [1] and non-magnetic metallic thin film layer [2] may be obtained when Co-rich Co—Ni—Fe film indicated by the aforesaid formula (3) and formula (4) which is different from the magnetic thin film layer [1] is used in combination with the aforesaid magnetic thin film layer [1]. The magneto-resistance effect element composed of only the magnetic thin film layer [3] and non-magnetic metallic thin film layer [2] is also effective, when the magnetic field to be sensed is large and a large ΔR/R is required.

Figure 1A:
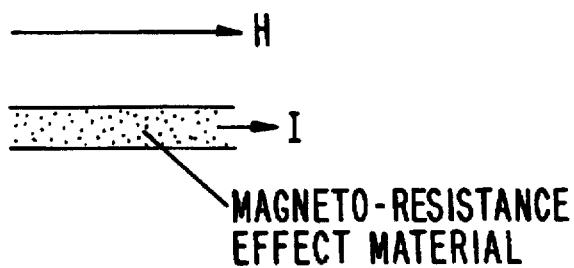
FIG. 1 (a) indicates an example of the construction of the present invention wherein the direction of magnetic field H and the direction of current I are in parallel while FIG. 1 (b) indicates an example of the conventional construction where the direction of magnetic field H and direction of current I are in right angle.
Figure 1B:
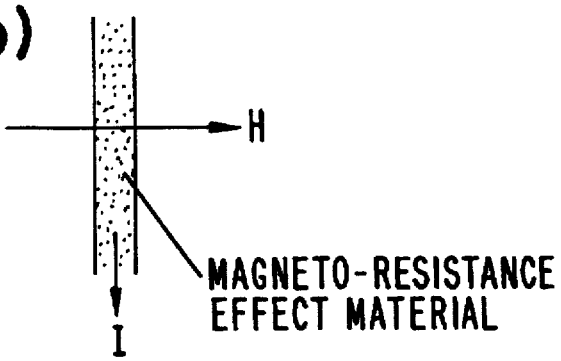

The magnetic thin film layer to be interposed between the magnetic thin film layers [1] (or [1] and [3]) is required to indicate less reactivity at its interface to the magnetic thin film layer [1] (or [1] and [3]) which has the compositions indicated by the aforesaid forumlae (1)–(4) and also it is required to be non-magnetic. Therefore, Cu, Ag, Au, Pt, Ru etc. are suitable and the most preferred film is the one made of Cu. When the thickness of nonmagnetic metallic layer [2] is more than 50 Å, the magnetic bond between magnetic thin film layer [1] (or [1] and [3]) which are bonded via the non-magnetic metallic thin film layer [2] weakens severely, whereas when there exists no non-magnetic metallic thin film layer [2] or when its thickness is less than 5 Å, the magnetic thin film layers [1] (or [1] and [3]) mutually make ferromagnetic bonding and the state as shown in FIG. 1 (a) can not be realized and large magneto-resistance effect is not obtained. Therefore it is preferred to make the thickness of non-magnetic metallic thin film layer [2] 5–50 Å. When a particularly large ΔR/R is required, it is preferred to make the thickness of non-magnetic metallic thin film layer [2] in about 9 Å i.e., 6–12 Å or about 20 Å i.e. 17–23 Å as indicted in the Examples and when soft magnetic characteristic and a large ΔR/R is required, it is desirable to use the magnetic thin film layer [1] and make the thickness of non-magnetic metallic thin film layer [2] 6–12 Å.

Hereinafter is described the effect of the present invention in reference to the concrete Examples.

EXAMPLE 1

Magneto-resistance element with the following composition was formed on a glass substrate using a multi-factor sputtering element, provided that N was the number of repetition and it was made to vary so that the total film thickness should become 2000 Å.

A: [Ni—Co—Fe(20)/Cu(20)/Co(20)/Cu(20)]$^N$ (the figures inside the parenthesis represent thickness (Å)).

For the target, $Ni_{0.8}Co_{0.1}Fe_{0.1}$ (for magnetic layer [1]), $Co_{0.9}Fe_{0.1}$ (magnetic layer [3]) and Cu (non-magnetic metallic layer [2]) with diameter of 80 mm were used and the film thickness was controlled by the shutter.

In the same way, using $Ni_{0.8}Co_{0.05}Fe_{0.15}$ (magnetic layer [1], $Ni_{0.8}Co_{0.2}$ (magnetic layer [1]) and Cu (non-magnetic metallic layer [2]) with diameter of 80 mm for the target, B: [Ni—Co—Fe(30)/Cu(9)]$^{N1}$ C: [Ni—Co(Co)/Cu(9)]$^{N2}$ were prepared, provided that N1 and N2 are the repetition frequency which has been made to vary so that total thickness should become about 2,000 Å.

(the figures in the parenthesis represent the thickness (Å))

Figure 2:
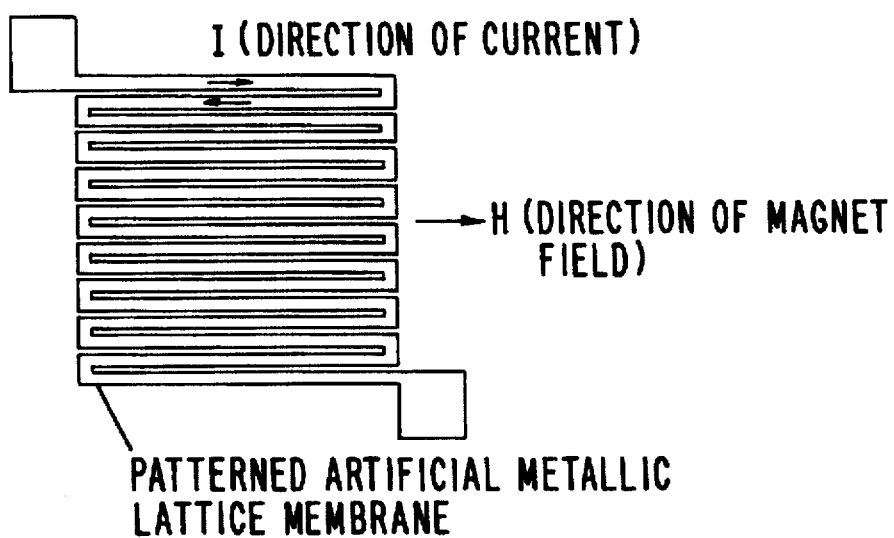
FIG. 2 indicates an example of the manufactured magneto-resistance element of the present invention.

It was patterned into the shape as shown in FIG. 2 and the magneto-resistance element wherein the direction of the magnetic field to be sensed and the direction of current of the aforesaid artificial metallic lattice magneto-resistance film become mutually parallel. For comparison, the magneto-resistance element where the direction of the magnetic field to be sensed and the direction of current of the said artificial metallic lattice magneto-resistance film are in right angle has also been manufactured and at the same time, the magneto-resistance elements where the direction of magnetic field to be sensed and the direction of the current of most of the Ni—Fe film are in parallel and those where it is in right angle were manufactured with the conventional Ni—Fe film and their characteristics were compared. MR characteristics (ΔR/R) of thus obtained magneto-resistance elements was measured at room temperature at maximum impression magnetic field of 500 Oe. The obtained values (%) are shown in Table 1.

TABLE 1

| Magneto-resistance effect membrane | Direction of magnetic field and electric current | ΔR/R (%) |
|---|---|---|
| A | Parallel | 15 |
|   | Right angle | 2 |
|   | 30° | 10 |
|   | 45° | 5 |
| B | Parallel | 20 |
|   | Right angle | 1 |
| C | Parallel | 18 |
|   | Right angle | 1 |
| Ni—Fe | Parallel | 0 |
|   | Right angle | 2 |

As indicated in Table 1, the magneto-resistance effect element of novel construction where the artificial metallic lattice film of the present invention is used as the magneto-resistance effect film and where the direction of current and that of magnetic field are not in parallel as in the case of the conventional element indicates a large MR characteristic which has been impossible with the magneto-resistance effect element using the conventional Ni—Fe film. When the dependency of MR characteristics on the direction of magnetic field is investigated, it was found that MR characteristics are improved as the angle made by the direction of the impressed magnetic field and the direction of current of magneto-resistance effect element of the present invention becomes smaller (in other words closer to parallel) and in order that the characteristics of the material of the present invention is superior to that of the conventional material such as Ni—Co, it is necessary that the angle is less than 45°, preferably less than 30°.

As stated above, the present invention enables to obtain the magneto-resistance element which indicates a large magneto-resistance effect at room temperature and under low impression magnetic field, through employment of such composition as effectively utilized the characteristics of the artificial, metallic lattice membrane and therefore the material of the present invention is suitable for application to the high sensitivity MR sensor, etc.

What is claimed is:

1. A magneto-resistance effect element wherein electric current passes through a magneto-resistance effect material configured in a substantially serpentine manner, wherein a demagnetization field coefficient in the direction of the current is smaller than demagnetization field coefficients in directions other than the direction of current flow and an external magnetic field strength is measured by the change of resistance of said magneto-resistance effect material caused by the external magnetic field, wherein the major amount of the electric current passing through the magneto-resistance effect material configured as aforesaid is in parallel to the direction of said external magnetic field, and said magneto-resistance effect material is composed of an artificial metallic lattice membrane which has a structure such that a magnetic thin film layer with thickness of 5–50 Å and non-magnetic metallic thin film layer with thickness of 5–50 Å are interchangeably laminated, and wherein the non-magnetic metallic thin film layer is formed from a member selected from the group consisting of Cu, Ag, Au, Pt and Ru.

2. The magneto-resistance effect element according to claim 1, wherein the angle made by the direction of said external magnetic field and the direction of electric current running through the magneto-resistance effect material is less than 45°.

* * * * *